United States Patent [19]

Jeuch

[11] Patent Number: 4,786,960
[45] Date of Patent: Nov. 22, 1988

[54] CMOS INTEGRATED CIRCUIT AND PROCESS FOR PRODUCING AN ELECTRIC ISOLATION ZONES IN SAID INTEGRATED CIRCUIT

[75] Inventor: Pierre Jeuch, Seyssins, France

[73] Assignee: Commissariat A L'Energie Atomique, Paris, France

[21] Appl. No.: 77,092

[22] Filed: Jul. 23, 1987

Related U.S. Application Data

[63] Continuation of Ser. No. 759,755, Jul. 29, 1985, abandoned.

[30] Foreign Application Priority Data

Aug. 7, 1984 [FR]  France ................................ 84 12463

[51] Int. Cl.⁴ .............................................. H01L 27/02
[52] U.S. Cl. ........................................ 357/42; 357/49; 357/55
[58] Field of Search ............................. 357/42, 49, 55

[56] References Cited

U.S. PATENT DOCUMENTS

| | | | |
|---|---|---|---|
| 4,044,452 | 8/1977 | Abbas et al. ...................... | 437/70 |
| 4,454,646 | 6/1984 | Joy et al. ........................... | 357/49 |
| 4,503,451 | 3/1985 | Lund et al. ........................ | 357/42 |
| 4,528,581 | 7/1985 | Lee .................................... | 357/42 |
| 4,589,193 | 5/1986 | Goth et al. ........................ | 357/49 |
| 4,621,276 | 11/1986 | Malhi ................................ | 357/42 |

FOREIGN PATENT DOCUMENTS 0073370  3/1983  European Pat. Off. .

OTHER PUBLICATIONS

RCA Technical Note by Dennely, #876, 2/12/71.
IEDM Conference Record, 1983, pp. 23-26.
IBM Technical Disclosure Bulletin, vol. 26, No. 3A, aout 1983, pp. 940-941, New York, US; G. A. Sai-Halasz et al., "Bipolar Dynamic Ram Cell Structure with Low Soft-Error Rate".
IBM Technical Disclosure Bulletin, vol. 24, No. 7A, Dec. 1982, pp. 3350-3352, New York, US, H. H. Chao et al., "Heavy Doping Isolation for CMOS Integrated Circuits".
Electronic Design, vol. 31, No. 22, Oct. 1983, pp. 44-51, Waseca, MN., Denville, N.J., US, "CMOS Advances Clearing Speed and Density Hurdles".
IBM Technical Disclosure Bulletin, vol. 25, No. 9, Feb. 1983, pp. 4768-4772, New York, US, C. G. Jambotkar, "Method to Realize Submicrometer-Wide Images".

Primary Examiner—Andrew J. James
Assistant Examiner—Mark Prenty
Attorney, Agent, or Firm—Oblon, Fisher, Spivak, McClelland & Maier

[57] ABSTRACT

CMOS integrated circuit and process for the production of electric isolation zones in the integrated circuit.

According to the invention the process comprises the following stages: formation of several trenches in a silicon substrate, thermal oxidation of the substrate leading to the formation of an oxide film on the sides and bottom of the trenches, elimination of the oxide film near the bottom of the trenches and filling the trenches with a conductive material, thus constituting an electrode connected to the substrate corresponding to the circuit earth.

5 Claims, 3 Drawing Sheets

CMOS INTEGRATED CIRCUIT AND PROCESS FOR PRODUCING AN ELECTRIC ISOLATION ZONES IN SAID INTEGRATED CIRCUIT

This application is a continuation of application Ser. No. 759,755 filed on July 29, 1985, now abandoned.

BACKGROUND OF THE INVENTION

The present invention relates to a CMOS integrated circuit and to a process for producing electric isolation zones in such an integrated circuit. It more particularly applies to the fields of electronics and data processing for in particular obtaining logic gates, flip-flops, read-only and random-access memories, etc.

The desire to obtain a high integration density in CMOS integrated circuits makes it necessary to use a special isolation procedure between the different components of said circuits, and particularly between the n-channel transistors and the p-channel transistors of said CMOS circuits, when it is wished to reduce the distance between the complementary transistors.

One of the recent isolation methods used for this purpose is based on the formation of trenches in the semiconductor substrate, which are then oxidized and filled with a material such as polycrystalline silicon or silicon oxide. The trenches are filled by the deposition of the filling material over the entire surface of the integrated circuit, followed by the removal of the excess of said material deposited outside the trenches. This excess can be removed by mechanical or plasma etching. Generally, above the trench is then formed a local field oxide.

This procedure of isolation by trenches surmounted by a local field oxide has in particular been described in the IEDM article, 1982, pp. 237 to 240, entitled "Deep trench isolated CMOS devices".

This isolation method makes it possible to reach considerable isolation depths (several μm) between the different components of the integrated circuits whilst ensuring a good surface isolation. Unfortunately, in such an isolation method, the problem arises of a conductivity inversion on the sides of the isolation trenches and consequently of the formation of a parasitic channel. This parasitic conductivity inversion problem is particularly described in the IEDM article, 1983, pp. 23 to 26 entitled "Characterization and modeling of the trench surface inversion problem for the trench isolated CMOS technology" of Kit. M. Cham, et al, and makes it necessary to remove the transistors from the isolation trenches and more specifically the n-channel transistors of the CMOS circuit, thus limiting the integration density of said integrated circuits.

This is illustrated in FIGS. 1 and 2, which diagrammatically show in plan view and longitudinal section, part of a prior art CMOS integrated circuit at an isolation trench. In FIGS. 1 and 2, references 52 and 54 respectively represent the regions Occupied by a p-channel transistor and a n-channel transistor. These two transistors are e.g. produced in the same p-silicon, substrate 56, reference numeral 58 corresponding to a n-type recess in which the p-channel transistor is formed. These two transistors are electrically isolated from one another by an isolation trench 60 formed in the substrate. The sides and bottom of trench 16 are covered with an oxide film 62 and the interior of the trench is filled with a more particularly isolating material 64. Isolation trench 60 is surmounted by a field oxide 66. Reference numeral 68 corresponds to the generally doped polycrystalline silicon conductive coating, in which the gates of the two transistors are formed.

As shown in FIGS. 1 and 2, transistors 52 and 54 are necessarily located at a certain distance d from the isolation trench 60 in order to prevent the formation of a parasitic channel due to conductivity inversion on the sides of the trench. The region separating the trench from the transistors being a field oxide region 66 (FIG. 1).

SUMMARY OF THE INVENTION

The present invention relates to a CMOS integrated circuit and to a process for producing electric isolation zones in such an integrated circuit making it possible to obviate the various disadvantages referred to hereinbefore. In particular the CMOS integrated circuit according to the invention using the trench isolation method has a much higher integration density than the prior art CMOS circuits. Moreover, this circuit does not suffer from conductivity inversion on the sides of the trenches and consequently has no parasitic channel.

More specifically, the invention relates to a CMOS integrated circuit having n-channel MOS transistors and p-channel MOS transistors formed on the same silicon substrate and electrically isolated from one another by the isolation trench, wherein said trenches are in contact with said transistors, without there being a field oxide between the trenches and the transistors, a conductive electrode connected to earth being formed within each isolation trench.

The presence of conductive electrodes in the isolation trenches makes it possible to prevent any conductivity inversion on the sides of said isolation trenches and in particular on the side of the n-channel transistors of the CMOS circuits, which makes it possible to move the transistors as close as possible to the isolation trenches.

The invention also relates to a process for producing electric isolation zones serving to electrically isolate from one another the various MOS transistors of a CMOS integrated circuit and in particularly the n-channel transistors and the p-channel transistors of said circuits.

According to the invention, the process comprises the following stages:
(a) formation of several trenches in a silicon substrate.
(b) thermal oxidation of the substrate leading to the formation of an oxide film on the sides and bottom of the trenches;
(c) elimination of the oxide film from the bottom of the trenches, and
(d) filling the trenches with a conductive material.

Thus, steps (c) and (d) of the production process according to the invention make it possible to form a polycrystalline silicon conductive electrode connected to the silicon substrate, i.e. to earth within each isolation trench.

Advantageously step (c) is carried out by a process for the anisotropic etching of the oxide film, such as a reactive ionic etching process.

According to a preferred embodiment of the process according to the invention, the following (step c), doping takes place in the bottom of the trenches, i.e. doping of the substrate just below the trenches, which is e.g. carried out by ion implantation.

This doping ensures a better electrical connection between the conductive electrodes formed in the trenches and the semiconductor substrate whilst avoiding the formation of excessively deep trenches.

According to another preferred embodiment of the process according to the invention, the substrate is constituted by a weakly doped zone surmounting a strongly doped zone, the weakly doped zone being obtained by epitaxy from the strongly doped zones.

Such a substrate has the advantage of a higher doping in depth than in surface, which makes it possible to avoid a possible latch up of the CMOS circuit.

According to a preferred embodiment of the process according to the invention, the filling material is polycrystalline silicon or a silicide of a refractory metal. Preferably, the polycrystalline silicon undergoes n+ or p+ doping and the silicide is tungsten silicide ($WSi_2$).

Advantageously, step d is followed by a local field oxide being formed above each trench which ensures a good surface isolation between the different components of the integrated circuit.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
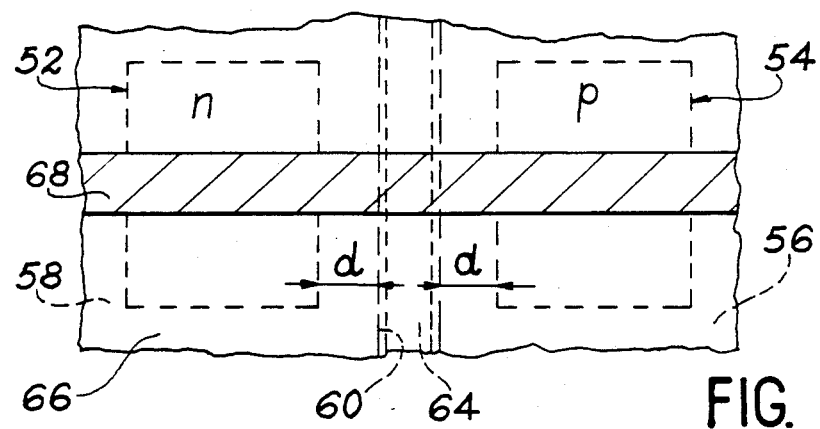
FIGS. 1 and 2 already described, diagrammatically in plan view and longitudinal section part of a prior art CMOS circuit at the isolation trench.
Figure 2:
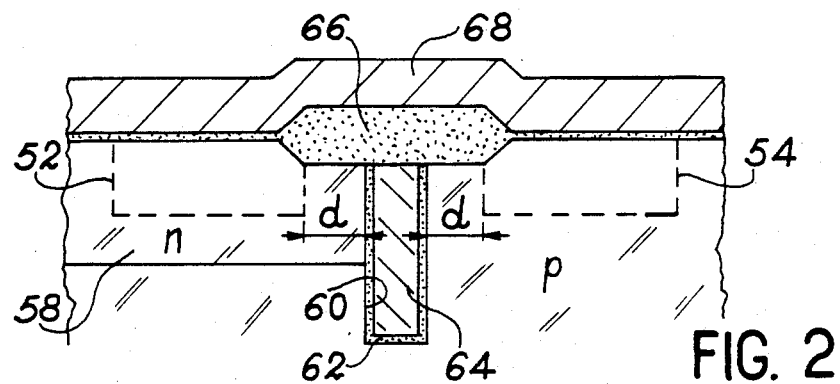

The following description relates to the production of an isolation zone between a n-channel MOS transistor and a p-channel MOS transistor of a n-recess CMOS circuit, i.e. formed on a p-type substrate, as well as to the corresponding part of the CMOS integrated circuit. Obviously, the process according to the invention has a much more general application. It can be used whenever it is wished to isolate a number of components of a CMOS integrated circuit from one another, such as two n-channel transistors or two p-channel transistors.

In the case represented in FIGS. 3 to 9, the monocrystalline silicon substrate 2 comprises a type p+ zone 2a, which is particular has at least $10^{16}$ atoms/cm$^3$ of boron ions, from which in per se known manner has been epitaxies a type p zone 2b. The n-channel transistor will be subsequently formed in said zone 2b. Moreover, in the epitaxial zone 2b is formed a type n recess 2c, in which will be subsequently formed a p-channel transistor. This type n recess 2c is formed in conventional manner by diffusion or implantation of ions, particularly phosphorus and doses of $5.10^{12}$ atoms/cm$^2$.

The concentration of type p impurities (boron) in substrate 2, higher in depth (zone 2a) then in surface (zone 2b), makes it possible to prevent the latch up of the n+ pnp+ structure produced by n+ sources and P+ sources of n-channel and p-channel transistors, substrate p and recess 10.

Figure 3:
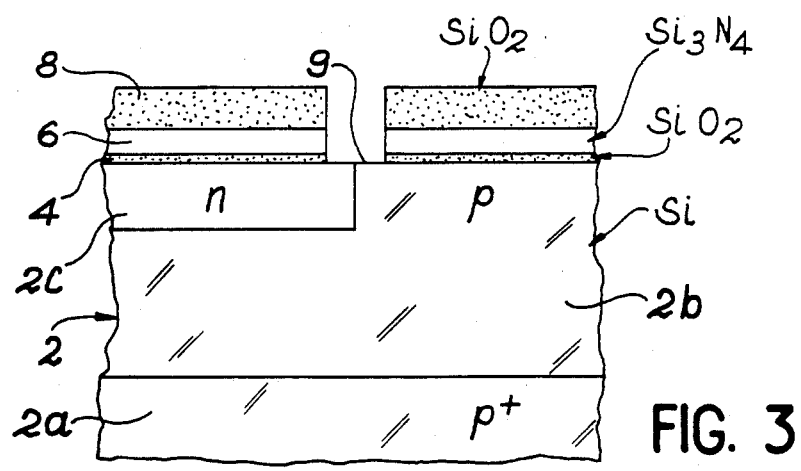
FIGS. 3 to 8 diagrammatically and in longitudinal section, the different steps of the process for producing isolating zones in a CMOS circuit according to the invention.

Following the formation of substrate 2, the latter is covered in the manner shown in FIG. 3 by a layer 4 of insulating material, preferably silicon dioxide ($SiO_2$). Layer 4 can in particular be obtained by a thermal oxidation of the silicon substrate 2 at a temperature of 900° C. The layer 4 will have a thickness varying between 100 and 500 Å.

On said silicon dioxide film 4 will then be produced another insulating coating 6, preferably of silicon nitride, ($si_3N_4$). This silicon nitride coating 6 e.g. has a thickness of approximately 800 Å and can be obtained by deposition, particularly by chemical vapour phase deposition (CVD or LCVD). Following etching, said nitride coating 6 will be subsequently used for the location of the field oxide.

On coating 6 is then formed another insulating coating 8, preferably of silicon dioxide. Coating 8 has a thickness of approximately 1 μm. It can be obtained by deposition, particularly by chemical vapour phase deposition (CVD or LPCVD). Following etching, oxide coating 8 will be subsequently used as a bask for etching the trench in the substrate.

In the manner shown in FIG. 3, this is followed by a preferably anisotropic etching of the insulating coatings 4, 6 and 8, i.e. etching carried out in a single direction in space, so as to expose a region 9 of substrate 2 and in which the isolation trench will be subsequently formed. The etching of these three stacked coatings can be carried out following the deposition on insulating coating 8 of a not shown resin mask, produced by conventional photolithography processes and used for defining the position of the isolation trench to be formed.

The anisotropic etching of the isolation coatings 4, 6 and 8 can be carried out by reactive ionic dry etching using as the etching agent trifluoromethane ($CHF_3$), in the particular case where the coatings 4, 6 and 8 are respectively formed from silicon dioxide, silicon nitride and silicon dioxide.

Figure 4:
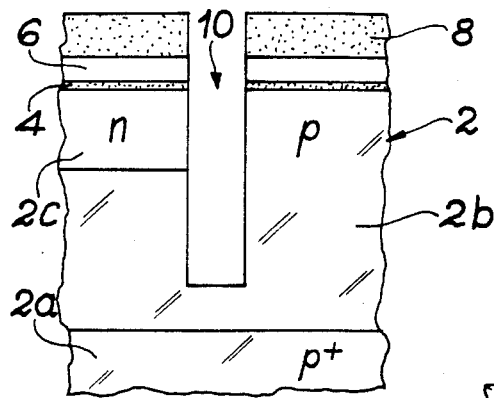

As shown in FIG. 4 the following stage of the process consists of carrying out preferably anisotropic etching of the exposed substrate region 9 so as to form trench 10. Preferably, trench 10 is deeper by approximately 1 μm than the typ n recess 2c, so as to prevent perforation between said recess and the electrode which will be subsequently produced in the trench. For example, the latter has a depth of approximately 5 μm, the recess 2c having a depth of approximately 4 μm. In addition, it has a width of approximately 1 μm.

Trench 10 can be produced by a reactive ionic etching process with as the etching agent carbon tetrachloride ($CCl_4$) or sulphur hexafluoride ($SF_6$). Said etching is carried out by using the etched silicon dioxide coating 8 as the mask.

Figure 5:
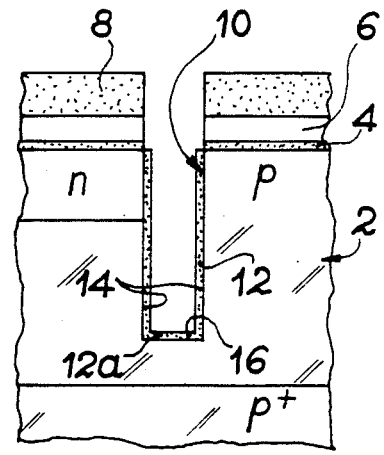

The following stage of the process as shown in FIG. 5 consists of thermally oxidizing the thermally etched substrate 2, e.g. at a temperature close to 1000° C. This oxidation makes it possible to obtain an oxide film 12 having a thickness of approximately 1000 Å covering the sides 14 of the trench, as well as the bottom 16 thereof.

Figure 6:
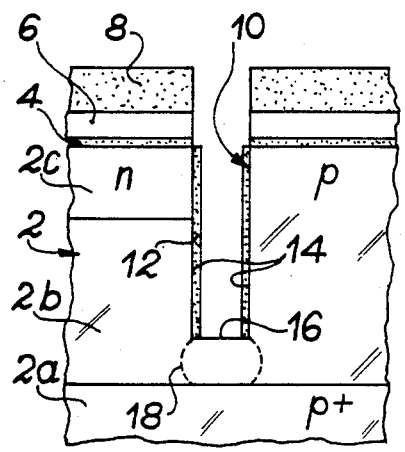

The following stages of the process described with reference to FIGS. 6 and 7 refer to the formation of a conductive electrode, within trench 10 and connected to substrate 2, i.e. to earth.

The formation of said conductive electrode in particular makes it possible to avoid any conductivity inversion on the trench sides 14 and in particular in the type p substrate region 2b, in which the n-channel transistor will be subsequently formed. The side of the trench on the side of region 2c of the type n substrate in which will subsequently be formed the p-channel transistor is much less sensitive to such parasitic inversion.

According to the invention, the conductive electrode is firstly produced by eliminating part 12a (FIG. 5) of the silicon dioxide film 12, located at the bottom 16 of trench 10. The structure obtained is shown in FIG. 6. This stage is carried out in preferred manner by an anisotropic etching process and particularly by a reactive ionic etching process using trifluoromethane (CHF$_3$) as the etching agent. The use of anisotropic etching makes it possible to eliminate region 12a of film 12 without eliminating those parts of the film located on sides 14 of trench 10. The etched silicon dioxide coating 8 used as a mask for said etching process.

The following stage of the process consists of carrying out doping in the bottom 16 of trench 10, in the substrate region located below trench 10, said doped region carrying the reference numeral 18. Doping is preferably carried out by ionic implantation with type p conductivity ions, such as e.g. boron ions having an energy of 100 keV and a dose of $2.10^{16}$ atoms/cm$^{-2}$. It makes it possible to ensure a better connection between the electrode, formed in trench 10, and substrate 2, whilst avoiding the formation of an excessively deep trench.

Figure 7:
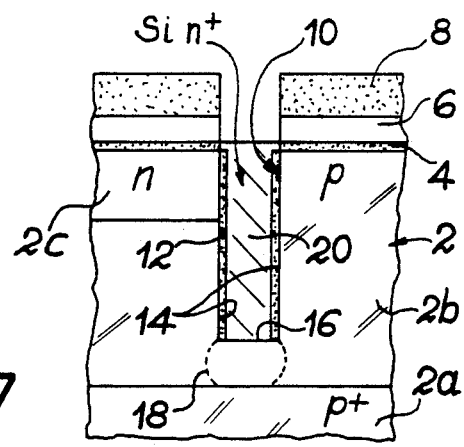

The final production stage of the conductive electrode within the trench 10 consists in the manner shown in FIG. 7 of filling trench 10 with a conductive material 20, more particularly constituted by polycrystalline silicon, preferably of type n$^+$ or p$^+$, or by a silicide, such as tungsten silicide (WSi$_2$). This filling can be carried out by isotropic deposition and in particular by vapour phase chemical deposition (CVD or LPCVD), so as to completely fill trench 10.

Following the filling of trench 10, if necessary, the excess conductive material 20 which can possibly be located outside trench 10 is aliminated, so as to only leave said material 20 within the trench, as shown in FIG. 7. For example, said elimination can be carried out by reactive ionic dry etching using sulphur hexafluoride as the etching agent.

Figure 8:
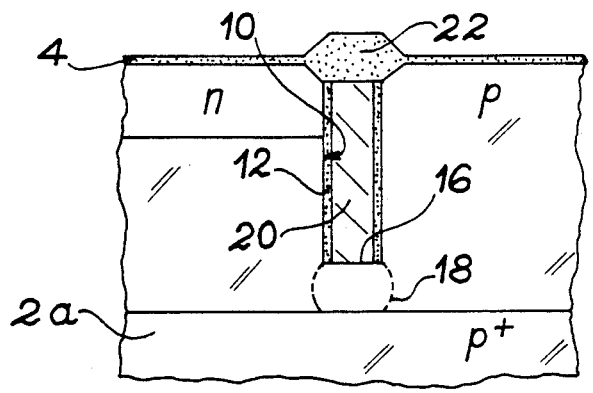

The following stage of the process, as shown in FIG. 8, consists of eliminating the silicon dioxide coating 8 used as the mask for producing trench 10 and for implantation in the bottom 16 of the trench. For example, wet etching is used with as the etching agent a mixture of hydrofluoric acid and ammonium fluoride.

The following stages of the process consist of producing in conventional manner a field oxide 22, e.g. by thermal oxidation of material 20 filling trench 10 when the latter is polycrystalline silicon, the etched silicon nitride film 6 serving to locate said field oxide on trench 10. The field oxide can have a thickness of approximately 6000 Å. It is then possible to eliminate the silicon nitride film 6, e.g. by chemical etching with orthophosphoric acid (H$_3$PO$_4$).

As a result of the formation of a conductive electrode within the isolation trenches, the process according to the invention makes it possible to improve the electric isolation between the different components of CMOS integrated circuits, and particularly the isolation between type n transistors and type p transistors of said circuits.

Figure 9:
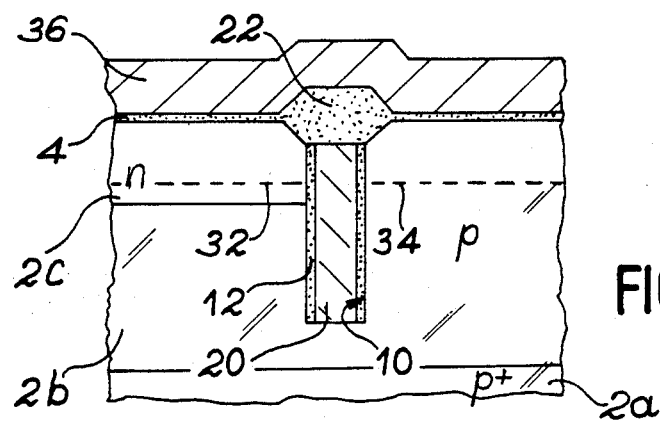
FIGS. 9 and 10 diagrammatically, in plan view and in longitudinal section, part of a CMOS integrated circuit according to the invention.
Figure 10:
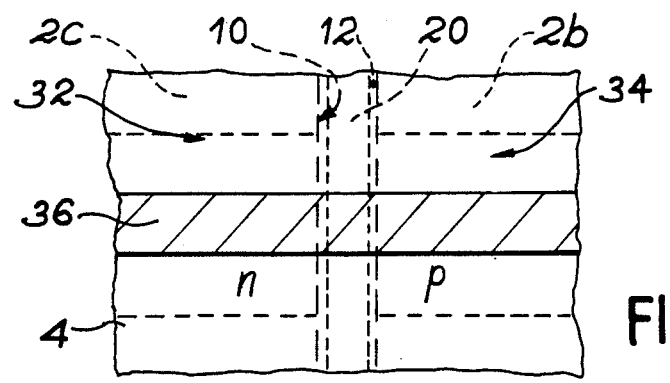

Thus, the presence of the conductive electrode connected to earth within the trench 10 makes it possible to avoid conductivity inversions on the sides of said trench and consequently the formation of a parasitic channel. This makes it possible to produced the n and p-channel transistors of the CMOS circuit, in such a way that they are in contact with the isolation trench, which is not the case in the prior art. This is illustrated by FIGS. 9 and 10.

In the latter references 32 and 34 respectively represent the regions occupied by the p-channel transistor and the n-channel transistor. Reference numeral 36 corresponds to a conductive layer, generally of doped polycrystalline silicon, in which are formed the gates of the two transistors. According to the invention, the transistors 32 and 34 are in contact with the isolation trench 10, without any field oxide region 22 being provided within trench 10 and transistors 32 and 34 (FIG. 10).

What is claimed is:

1. A CMOS integrated circuit having at least one n-channel MOS transistor and at least one p-channel MOS transistor formed on a same silicon substrate having a determined conductivity type and corresponding to the circuit ground, an isolation trench having a layer of insulating material on the side walls of said trench only for electrically isolating said n-channel transistor from said p-channel transistor, a gate common to said n-channel transistor and to said p-channel transistor crossing said isolation trench in a first direction, corresponding to the channel width direction said isolation trench being in direct contact with the channels of said transistors in said first direction at the location where the gate crosses the trench, without there being a field oxide between said transistors and said trench, said trench being filled with a filling conductive material constituting a conductive electrode, which is electrically connected to said substrate and grounded by means of a doping formed in the bottom of said trench and which has the same conductivity type of said substrate.

2. An integrated circuit according to claim 1, wherein the substrate comprises a weakly doped zone surmounting a strongly doped zone, the weakly doped zone being obtained by epitaxy from the strongly doped zone.

3. An integrated circuit according to claim 1, wherein the filling material is polycrystalline silicon or a refractory metal silicide.

4. An integrated circuit according to claim 3, wherein the polycrystalline silicon is n$^+$ doped or p$^+$ doped.

5. An integrated circuit according to claim 3, wherein the silicide is tungsten silicide.

* * * * *